United States Patent [19]
Endo et al.

[11] Patent Number: 5,517,525
[45] Date of Patent: May 14, 1996

[54] OPTICAL WAVELENGTH CONVERTING DEVICE

[75] Inventors: Tetsuro Endo; Kiichiro Shinokura, both of Tendo, Japan

[73] Assignees: Tohoku Pioneer Electronic Corporation, Yamagata; Pioneer Electronic Corporation, Tokyo, both of Japan

[21] Appl. No.: 396,984

[22] Filed: Mar. 1, 1995

[30] Foreign Application Priority Data

Mar. 2, 1994 [JP] Japan ................ 6-032457

[51] Int. Cl.$^6$ ............................... H01S 3/10
[52] U.S. Cl. ........................... 372/21; 372/32
[58] Field of Search ................. 372/6, 21, 22, 372/29, 32, 34, 703; 359/326

[56] References Cited

U.S. PATENT DOCUMENTS

| | | | |
|---|---|---|---|
| 4,682,335 | 7/1987 | Hughes | 372/6 |
| 4,887,900 | 12/1989 | Hall | 372/32 |
| 5,025,448 | 6/1991 | Sudo et al. | 372/32 |
| 5,136,420 | 8/1992 | Inagaki et al. | 372/6 |
| 5,337,324 | 8/1994 | Ohtsu et al. | 372/6 |

Primary Examiner—Rodney B. Bovernick
Assistant Examiner—Robert E. Wise
Attorney, Agent, or Firm—Fish & Richardson

[57] ABSTRACT

An optical wavelength converting device comprises; a semiconductor laser emitting a fundamental wave; a waveguide-type optical wavelength converting element having a core made of a nonlinear optical material and a clad surrounding the core; and a converging optical system for converging the fundamental wave onto an input end of the waveguide, characterized in that the device further comprises; an adjusting optical system for adjusting a quantity of backward light backed from the optical wavelength converting element to the semiconductor disposed in the coupling optical system; a reflecting portion for reflecting the fundamental wave disposed in the an optical wavelength converting element or the coupling optical system; a current controller for changing an electric current to be supplied to the semiconductor laser; and an optical-path-length stabilizing device comprising a supporting plate for supporting the semiconductor laser, the coupling optical system and the an optical wavelength converting element to keep constant an optical path length between the semiconductor laser and the reflecting portion; and a temperature tuner for changing temperature of at least one of the supporting plate and the semiconductor laser to keep a predetermined temperature thereof constant.

3 Claims, 3 Drawing Sheets

OPTICAL WAVELENGTH CONVERTING DEVICE

BACKGROUND OF THE INVENTION

1. Field of the Invention

The present invention relates to an optical wavelength converting device comprising a waveguide of core made of a nonlinear optical crystal and a clad surrounding the core for converting a wavelength of a fundamental wave entering the core to a ½ wavelength of a secondary harmonic, which utilizes the so-called Secondary Harmonic Generation.

2. Description of the related art

There are an optical wavelength converting element having a waveguide made of a secondary nonlinear optical crystal with a periodic domain inversion structure, which generates the secondary harmonic by using quasi-phase matching (QPM) when a fundamental wave is injected and passes though the waveguide. Such an optical wavelength converting element using the QPM and SHG is so called a QPM-SHG element. The periodic domain inversion structure of the QPM-SHG element is a domain-inverted grating in which the polarization direction of the waveguide is periodically and alternately inverted along the extending direction per coherence length. The waveguide of the QPM-SHG element has an output property that as this secondary harmonic output propagates, it periodically reaches the peak and trough levels every coherence length during the propagation of the fundamental wave. In this way, the QPM-SHG element adds the outputs to increase the total secondary harmonic output, by utilizing the domain-inverted grating portion in the waveguide.

Generally, a QPM-SHG element comprising a $LiTaO_3$ substrate has a high optical conversion efficiency but has a considerably small degree of permitted limit for the fundamental wavelength injected therein. Therefore, when only using such a QPM-SHG element and a semiconductor laser emitting a fundamental wave the wavelength of which fluctuates caused by a driving current or temperature, it is difficult to achieve a stable wavelength conversion with a high efficiency.

There are a spectral feedback intra-cavity method for feed-backing a fundamental wave emitted from a semiconductor laser and passing a QPM-SHG element to that semiconductor laser to stabilize the stimulated wavelength of fundamental wave. As shown in FIG. 1, a semiconductor laser 1 is optically coupled through a coupling optical system 2 to one end of a waveguide 4 with a domain-inversion in a QPM-SHG element 3, and the secondary harmonic and fundamental wave emitted from the other end of the waveguide through a coupling optical system 5 are separated by a dichroic mirror 6. Only the separated fundamental wave is reflected by an external grating 7 to be feed-backed through the waveguide 4 to the semiconductor laser 1. In this way, the wavelength tuning of semiconductor laser is achieved by the feedback of fundamental wave to the waveguide with rotation angle of the external grating so that the emission of laser beam is stabilized.

A semiconductor laser inherently has many stimulated modes. One of the modes may be mode-locked by injecting a laser beam from the out side to the semiconductor laser so that a single-mode light is stimulated by the external light. Namely, induced emission occurs in the semiconductor laser in a such a manner that light having the same wavelength of light entering a laser medium from the out side is gradually amplified and stimulated. Therefore, the stimulated light is stabilized by feedback of light of a constant wavelength from the external grating.

By using the external feedback of the backward light of a single wavelength i.e., the spectral feedback intra-cavity method, the emission of semiconductor laser is stabilized. Not only the QPM-SHG element but also other SHG elements are utilized as far as a light beam of fundamental wave is injected to the end surface of waveguide of the optical wavelength converting element, so that the secondary harmonic having a ½ wavelength as great as that of the fundamental wave is obtained.

Although there is a demand for high stabilities both of a stimulated wavelength of a fundamental wave and an output level of the semiconductor laser as a light source to be used in an optical wavelength converting mechanism, a wavefor of the stimulated wavelength including a low frequency through a high frequency components causes a noise in the output of the optical wavelength converting output.

In the conventional optical wavelength converting mechanism, the fundamental wave of semiconductor laser is insufficient to be stabilized in its wavelength and output resulting in a lack of output stability of the secondary harmonic with a high noise. In addition, the applied electric current to the semiconductor laser is restricted, so that a high-output optical wavelength converting device becomes unusable or inoperative.

SUMMARY OF THE INVENTION

Therefore, the present invention is made to overcame such a problem, and an object of the present invention is to provide a high-output optical wavelength converting device securing of the stability a semiconductor laser.

An optical wavelength converting device according to the present invention

According to the present invention, a semiconductor laser is stabilized, so that an optical wavelength converting device capable of converting wavelength at a high efficiency and a low noise.

BRIEF DESCRIPTION OF THE DRAWINGS

The features of the present invention are set forth with particularity in the appended claims. The invention together with other objects and advantages thereof may be understood by reference to the following description of the presently preferred embodiments together with the accompanying drawing in which:

DETAILED DESCRIPTION OF THE PREFERRED EMBODIMENTS

Preferred embodiments according to the present invention will be described referring to the accompanying drawings.

Figure 1:
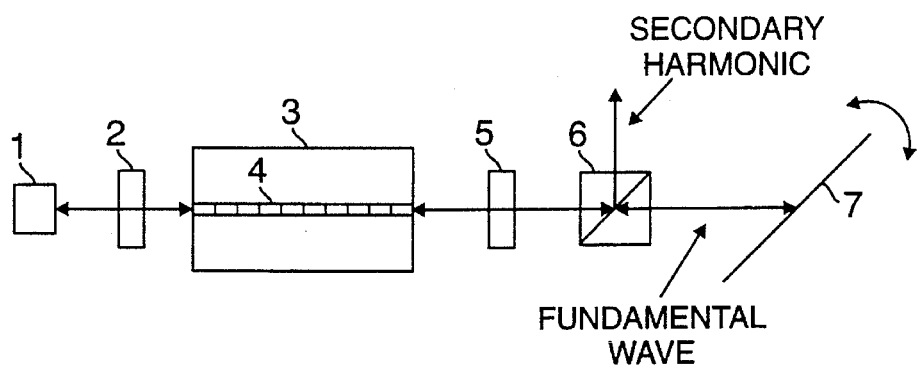
FIG. 1 is a schematic diagram showing a conventional optical wavelength converter using an external grating in the spectral feedback intra-cavity method.
Figure 2:
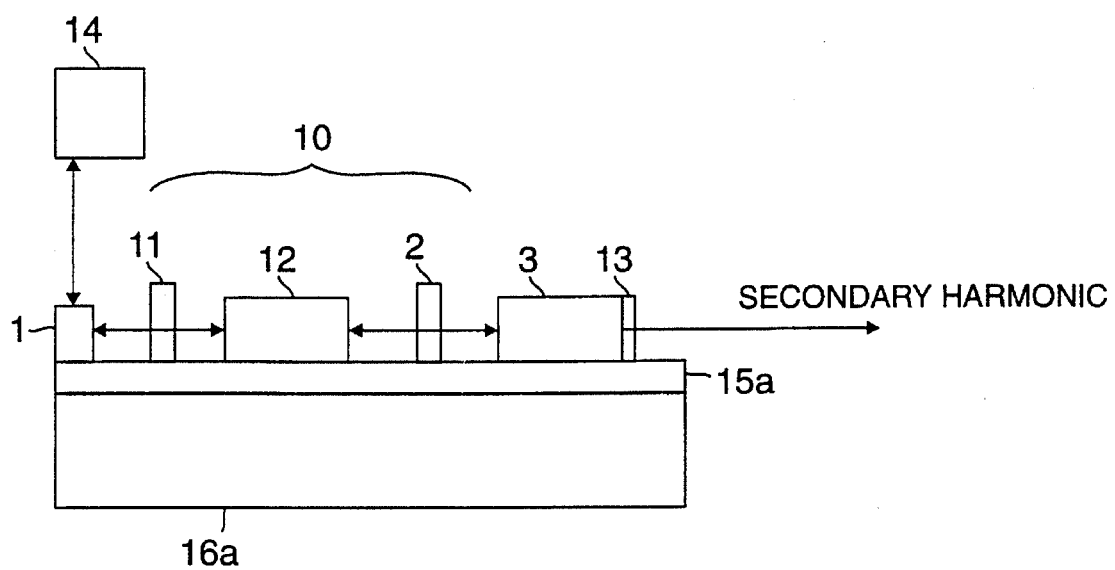
FIG. 2 is a schematic diagram of an optical wavelength converting device of an embodiment according to the present invention.

As shown in FIG. 2, a first embodiment of an optical wavelength converting device comprises a semiconductor laser 1, a coupling optical system 10 and an optical wavelength converting element 3 arranged in order along an optical axis. This optical wavelength converting element 3 has a core made of a nonlinear optical material and a clad enclosing the core, providing a reflecting film 13. The semiconductor laser 1 emits a fundamental wave. The coupling optical system 10 couples the fundamental wave to an input end surface of the optical wavelength converting element 3.

The coupling optical system 10 of the optical wavelength converting device includes an adjusting optical system i.e., an optical isolator 12 disposed between convex lenses 11 and 2. The optical isolator 12 comprises a Faraday medium disposed between a polarizer and an analyzer at both ends in the optical axis and restricts and adjusts a quantity of he backward light backed from the reflecting film 13 of the optical wavelength converting element to keep it a predetermined constant value. The optical isolator 12 is previously set up to an isolation value of $1/30$ through $1/100$ as great as the inherent rated output of the semiconductor laser 1 to allow to pass the backward light through itself by such a value.

The reflecting film 13 is provided at the output end surface of the optical wavelength converting element 3 and reflects the fundamental wave back to the core. The reflecting film 13 is made of dielectric thin films so that the secondary harmonic passing through the reflecting film 13 but the fundamental wave is reflected. This dielectric thin film mirror selectively reflects the wavelength of entering light.

The semiconductor laser 1 is electrically connected to a current controller 14. The current controller 14 supplies an electric current to the semiconductor laser to change the supplied quantity of current to keep it constant. The current controller 14 therefore adjusts the supplied electric current to the semiconductor laser within a fluctuation range of plus and minus 0.1 mA with respect to a predetermined reference current value.

These optical members of the semiconductor laser 1, the coupling optical system 10 and the optical wavelength converting element 3 are fixed onto a supporting plate 15a to keep constant an optical path length between the semiconductor laser 1 and the reflecting film 13.

It is a feature that the embodiment of the optical wavelength converting device comprises a temperature tuner 16a such as a Peltier element or the like for changing temperature of the supporting plate 15a to control a thermal expansion of the supporting plate 15a and keep constant the optical path length between the semiconductor laser 1 and the reflecting film 13. That is, the embodiment comprises an optical-path-length stabilizing device including the temperature tuner 16a for heading and cooling the supporting plate 15a supporting the optical members. The temperature tuner 16a temperature-controls the semiconductor laser within a fluctuation range of temperature of plus and minus 0.1 centigrade degree with respect to a predetermined reference temperature, and at the same time it controls thermal expansion of the supporting plate 15 in such a manner that the distance between the semiconductor laser 1 and the reflecting film 13 of the optical wavelength converting element within a fluctuation range of a $1/8$ or less than the wavelength of the fundamental wave.

The output light of fundamental wave emitted from the semiconductor laser passes through the optical isolator and enters the optical wavelength converting element. The entering light propagates in the waveguide and is reflected by the reflecting film at the output end of the optical wavelength converting element and then, the reflected fundamental wave backs to the optical isolator again. Almost of the reflected fundamental wave is absorbed but the partial backward fundamental wave is allowed to passing the optical isolator by a quantity determined on the basis of the isolation value to back to the semiconductor laser.

The semiconductor laser is induced by light of an optical output of $1/1000$ or more than that of the emission to change its stimulated wavelength and the stimulation efficiency. When the phases of the backward light and the output light in the semiconductor laser, its stimulated wavelength is locked by that wavelength of the backward light at that time and then, its stimulation efficiency is stabilized responding to the intensity of the backward light. At least one of the temperature of the semiconductor laser, the current value of the semiconductor laser and the length of the supporting plate therefore should be controlled in such a manner that the optical path length between the semiconductor laser and the reflecting film of the optical wavelength converting element satisfies the phase-matching conditions of the output light and the backward light. In the first embodiment, the stimulated wavelength and output of the semiconductor laser are stabilized by means of the adjustment of temperature tuner controlling the thermal expansion supporting plate. Since the quantity of the backward light back to the semiconductor laser is little, the electric field intensity increases by only 10% or less, about 2% in the waveguide of the semiconductor laser. Therefore, the semiconductor laser is not destroyed by such an increased electric field nor the applied electric current to the semiconductor is not restricted by a rated electric current or less. As a result, the semiconductor laser is sufficiently operated at a high efficiency and a high output.

In the first embodiment, a reflecting portion for the fundamental wave i.e., the reflecting film is provide to the output end surface of the optical wavelength converting element. Instead of this system, another spectral feedback intra-cavity method or a localized cavity method described below may be employed, for example, an optical wavelength converting element includes a reflecting portion such as DBR disposed in the waveguide. The reflecting portion of DBR is very effective. The optical wavelength converting element may be selected from a group consisting of a bulk-block type, a fiber type, a waveguide type, a QPM-SHG element type, and a Cerenkov type.

The first embodiment of the an optical wavelength converting device is assembled as follows: a controllable temperature tuner is fixed on and under the supporting plate. The semiconductor laser connected to the current controller, the optical system for restricting the backward reflected light or the adjusting optical system, the optical wavelength converting element are fixed onto the supporting plate along the optical axis thereof under the conditions of the calculated theoretical positions. The whole of the supporting plate is temperature-controlled and then the semiconductor laser is temperature-controlled. The applied electric current to the semiconductor laser is adjusted and then, the distance between the semiconductor laser and the reflecting film of the optical wavelength converting element is adjusted in such a manner that the phases of the stimulated light and the backward light meet with each other in the waveguide of the semiconductor laser. As a result, a predetermined stimulated wavelength is increased in intensity or severity and its wavelength and output are stabilized.

Figure 3:
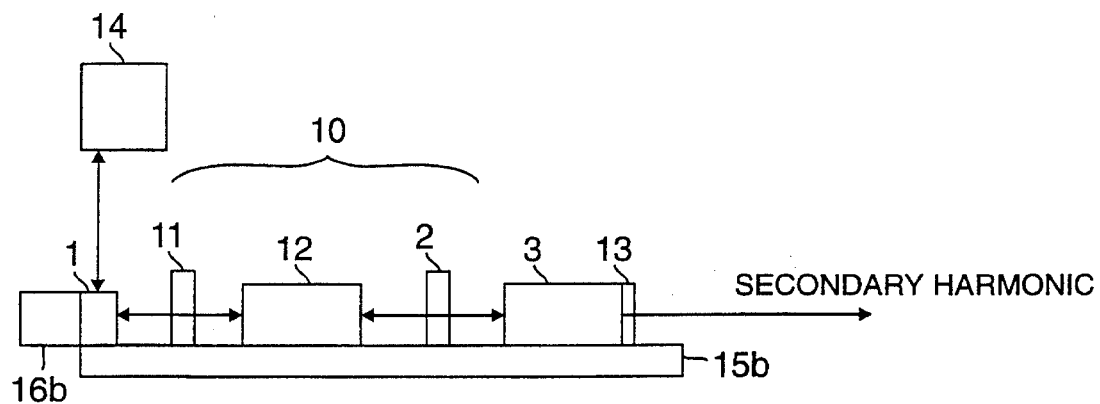
FIG. 3 is a schematic diagram of an optical wavelength converting device of another embodiment according to the present invention.

FIG. 3 shows a second embodiment according to the present invention, which has substantially the same structure as the first embodiment of the optical wavelength converting device excepting that an optical-path-length stabilizing device comprises a temperature tuner 16b for changing only temperatures of the semiconductor laser 1 and a supporting plate 15b having very little thermal expansion. In this device, the distance between the semiconductor laser 1 and the reflecting film 13 of the optical wavelength converting element is fixed by the supporting plate 15b made of a material having a very small thermal-expansion coefficient and, only the semiconductor laser 1 is temperature-controlled by the temperature tuner 16b.

The supporting plate 15b is made of a material having a very small thermal-expansion coefficient such as amber, super-amber, quarts glass. The optical path length in the active region or waveguide of the semiconductor laser 1 is temperature-controlled by the temperature tuner 16b, since the other optical members are fixed onto the supporting plate 15b of a very small thermal-expansion coefficient. At the same time, the applied electric current to is adjusted by the controller 14. Therefore, both the current control nd the optical path length control in the semiconductor laser bring the same effect of the first embodiment.

Figure 4:
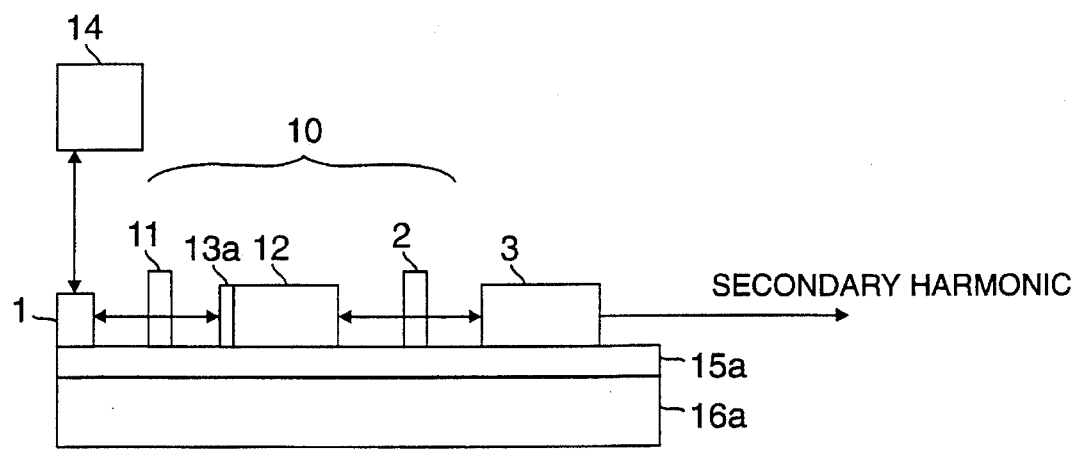
FIG. 4 is a schematic diagram of an optical wavelength converting device of a further embodiment according to the present invention.

FIG. 4 shows a third embodiment according to the present invention, which has substantially the same structure as the first embodiment of the optical wavelength converting device excepting that a fundamental wave a reflecting film 13a is provided to the input end surface of the optical isolator 12.

The reflecting film 13a has a reflecting coefficient of 5% through 15% with respect to the wavelength of the fundamental wave and restricts a quantity of light backed from the optical wavelength converting element.

The optical isolator 12 has an isolation value of −30 dB or more and interrupts the backward light backing from the downstream optical system.

The temperature tuner 16a controls temperature of the plate to adjust the optical path length between the semiconductor laser 1 and the reflecting film 13a and the controller 14 controls the applied electric current to the semiconductor laser 1, so that the third embodiment achieves the same effect of the first embodiment.

Figure 5:
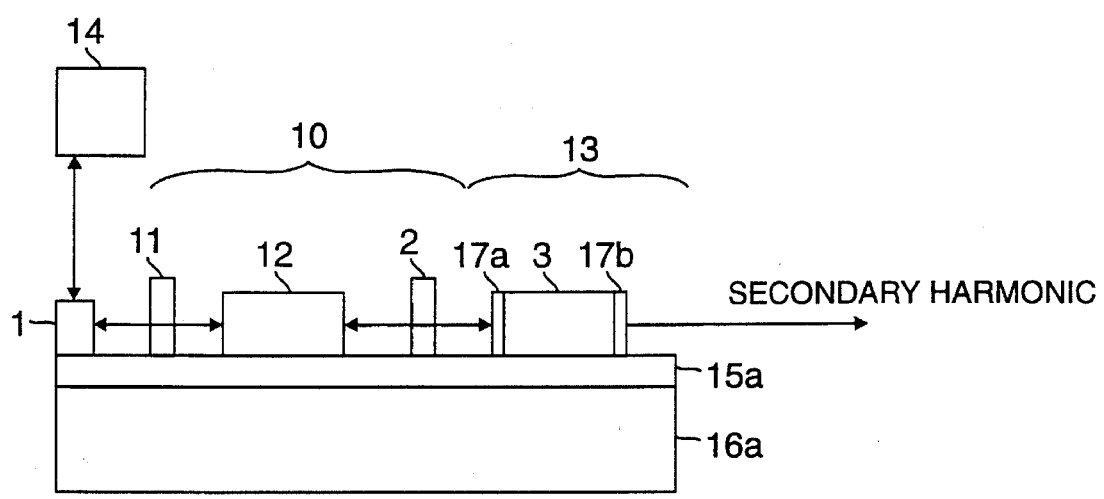
FIG. 5 is a schematic diagram of an optical wavelength converting device of another further embodiment according to the present invention.

FIG. 5 shows a fourth embodiment according to the present invention, which has substantially the same structure as the first embodiment of the optical wavelength converting device excepting that optical thin films 17a, 17b are provided to the input and output end surfaces of the optical wavelength converting device 3 respectively, which have a pertinent reflecting coefficient to the wavelength of the fundamental wave.

The optical thin films 17a, 17b and the optical wavelength converting element are constructed as a Fabry Perot cavity which become a reflecting portion 13 as a whole for reflecting the fundamental wave.

The temperature tuner 16a controls temperature of the plate 15a to adjust the optical path length between the semiconductor laser 1 and the reflecting portion 13 and the controller 14 controls the applied electric current to the semiconductor laser 1, so that the third embodiment achieves the same effect of the first embodiment.

As mentioned above, according to the present invention, a high converting efficiency, a high stability of emission and a low noise secondary harmonic are obtained in an optical wavelength converting mechanism including a semiconductor laser emitting a fundamental wave.

What is claimed is:

1. An optical wavelength converting device comprising; a semiconductor laser emitting a fundamental wave; a waveguide-type optical wavelength converting element having a waveguide of core made of a nonlinear optical material and a clad surrounding the core; and a converging optical system for converging said fundamental wave onto an input end surface of said optical wavelength converting element, characterized in that said optical wavelength converting device further comprises;

an adjusting optical system for adjusting a quantity of backward light backed from the optical wavelength converting element to said semiconductor laser disposed in said coupling optical system;

a reflecting portion for reflecting said fundamental wave disposed in said an optical wavelength converting element or said coupling optical system;

a current controller for changing an electric current to be supplied to said semiconductor laser; and an optical-path-length stabilizing device comprising a supporting plate for supporting said semiconductor laser, said coupling optical system and said an optical wavelength converting element to keep constant an optical path length between said semiconductor laser and said reflecting portion; and a temperature tuner for changing temperature of at least one of said supporting plate and said semiconductor laser to keep a predetermined temperature thereof constant.

2. An optical wavelength converting device according to claim 1, wherein said adjusting optical system includes an optical isolator.

3. An optical wavelength converting device according to claim 1, wherein said temperature tuner includes a Peltier element.

\* \* \* \* \*